(12) United States Patent
Kim et al.

(10) Patent No.: US 8,120,089 B2
(45) Date of Patent: Feb. 21, 2012

(54) NON-VOLATILE MEMORY DEVICE AND METHOD FOR FABRICATING NON-VOLATILE MEMORY DEVICE

(75) Inventors: Young-Hoo Kim, Seongnam-si (KR); Daehyuk Kang, Hwaseong-si (KR); Youngok Kim, Suwon-si (KR); Sang Won Bae, Incheon (KR); Boun Yoon, Seoul (KR); Kuntack Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 270 days.

(21) Appl. No.: 12/650,076

(22) Filed: Dec. 30, 2009

(65) Prior Publication Data

US 2010/0181610 A1   Jul. 22, 2010

(30) Foreign Application Priority Data

Jan. 19, 2009   (KR) .......................... 10-2009-0004232

(51) Int. Cl.
*H01L 29/76* (2006.01)

(52) U.S. Cl. ........... 257/314; 257/E29.309; 257/E21.21; 257/E21.679

(58) Field of Classification Search .................. 257/314, 257/E29.309, E21.18, E21.21, E21.423, E21.679
See application file for complete search history.

(56) References Cited

U.S. PATENT DOCUMENTS

| | | | |
|---|---|---|---|
| 2007/0158736 A1 * | 7/2007 | Arai et al. | ..................... 257/315 |
| 2008/0173928 A1 | 7/2008 | Arai et al. | |

FOREIGN PATENT DOCUMENTS

| | | |
|---|---|---|
| JP | 10-032269 | 2/1998 |
| JP | 2008-159699 | 7/2008 |
| JP | 2008-171838 | 7/2008 |
| KR | 1020080058251 A | 6/2008 |

* cited by examiner

*Primary Examiner* — Matthew Landau
*Assistant Examiner* — Colleen E Snow
(74) *Attorney, Agent, or Firm* — Myers, Bigel, Sibley & Sajovec, P.A.

(57) ABSTRACT

Provided are nonvolatile memory devices with a three-dimensional structure and methods of fabricating the same. The nonvolatile memory device includes conductive patterns three-dimensionally arranged on a semiconductor substrate, semiconductor patterns that extend from the semiconductor substrate and intersect one-side walls of the conductive patterns, charge storage layers interposed between the semiconductor patterns and one-side walls of the conductive patterns, and seed layer patterns interposed between the charge storage layers and one-side walls of the conductive patterns.

5 Claims, 13 Drawing Sheets

NON-VOLATILE MEMORY DEVICE AND METHOD FOR FABRICATING NON-VOLATILE MEMORY DEVICE

CROSS-REFERENCE TO RELATED APPLICATION

This U.S. non-provisional patent application claims priority under 35 U.S.C. §119 of Korean Patent Application 10-2009-0004232, filed on Jan. 19, 2009, the entire contents of which are hereby incorporated by reference.

BACKGROUND

An embodiment of the inventive concept relates to a nonvolatile memory device, and, more particularly, to a nonvolatile memory device with a three-dimensional structure capable of improving electrical characteristics and a method of fabricating the same.

In general, nonvolatile memory devices can electrically erase and program data and can retain data even if power source is interrupted. Recently, nonvolatile memory devices are increasingly used in various fields.

These nonvolatile memory devices are provided with various types of memory cell transistors. The nonvolatile memory devices are classified into NAND type and NOR type according to cell array structures. The NAND-type flash memory devices and the NOR-type nonvolatile memory devices have both merits and demerits in high integration and high-speed performance, respectively.

Specifically, NAND-type flash memory devices may be advantageous for high integration due to a cell string structure in which a plurality of memory cell transistors is connected in series. In addition, because NAND-type flash memory devices use operations that simultaneously change all information stored in the plurality of memory cell transistors, information update speed of the NAND-type flash memory devices is generally far faster than that of the NOR-type nonvolatile memory device. Due to the high integration and fast update speed, NAND-type flash memory devices are mainly used for portable electronic products that require a mass storage device, such as a digital camera and an MP3 player.

Research and development efforts have been active in promoting and improving markedly the merits of NAND-type flash memory devices. Recent developments have been made with respect to NAND-type flash memory devices with a three-dimensional structure.

SUMMARY OF THE INVENTION

An embodiment of the inventive concept is directed to an NAND-type flash memory device with a three-dimensional structure in which electrical characteristics are improved.

An embodiment of the inventive concept is also directed to a method of fabricating an NAND-type flash memory device with a three-dimensional structure in which electrical characteristics and efficiency in a fabricating process are improved.

An exemplary embodiment of the inventive concept is to provide a nonvolatile memory device including: conductive patterns three-dimensionally arranged on a semiconductor substrate; semiconductor patterns extending from the semiconductor substrate and intersecting one-side walls of the conductive patterns; charge storage layers interposed between the semiconductor patterns and one-side walls of the conductive patterns; and seed layer patterns interposed between the charge storage layers and one-side walls of the conductive patterns.

Another exemplary embodiment of the inventive concept is to provide a method of fabricating a nonvolatile memory device including: alternatively stacking first and second insulating layers having different etching rates, respectively, on a semiconductor substrate; forming a first trench that exposes one-side wall of the first and second insulating layers by penetrating the first and second insulating layers; faulting extended portions that extend in a direction parallel to the semiconductor substrate from the first trench by removing a portion of the second insulating layer exposed by the first trench; forming seed layer patterns that come in contact with a sidewall of the second insulating layer in the extended portions; forming a second trench that exposes the other sidewall of the first and second insulating layers by penetrating the first and second insulating layers; forming openings that expose the seed layer patterns by removing the second insulating layer exposed by the second trench; and forming locally conductive patterns in the openings by using the seed layer patterns.

BRIEF DESCRIPTION OF THE DRAWINGS

The accompanying drawings are included to provide a further understanding of the invention, and are incorporated in and constitute a part of this specification. The drawings illustrate example embodiments of the inventive concept and, together with the description, serve to explain principles of the inventive concept. In the drawings.

DETAILED DESCRIPTION

Exemplary embodiments of the inventive concept will be described below in more detail with reference to the accompanying drawings. The inventive concept may, however, be embodied in different forms and should not be constructed as limited to the embodiments set forth herein. Rather, these embodiments are provided so that this disclosure will be thorough and complete, and will fully convey the scope of the invention to those skilled in the art. Like numerals refer to like elements throughout the specification.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "comprises" and/ or "comprising," when used in this specification, specify the presence of stated features, integers, steps, operations, elements, and/or components, but do not preclude the presence or addition of one or more other features, integers, steps, operations, elements, components, and/or groups thereof. In addition, it will be understood that when a layer is referred to as being "on" another layer or a substrate, it may be directly on another layer or substrate or intervening layers may be present.

Example embodiments are described herein with reference to cross-sectional illustrations and/or plane illustrations that are schematic illustrations of idealized embodiments of example embodiments. In drawings, the thickness of layers and regions is exaggerated to effectively describe technical details. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Exemplary embodiments of the inventive concept will now be described in conjunction with the accompanying drawings. The nonvolatile memory device according to embodiments of the inventive concept has a three-dimensional structure.

Figure 1:
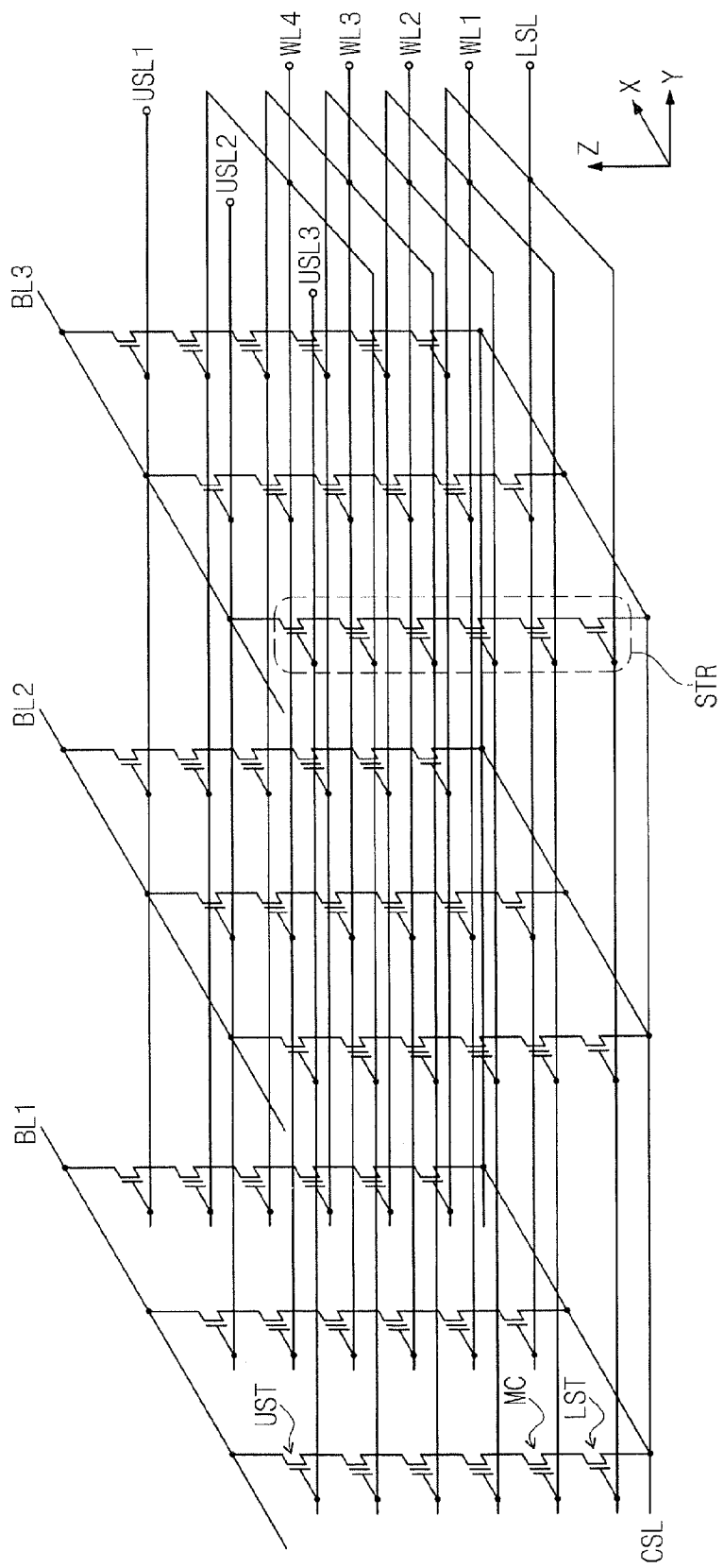
FIG. 1 is a schematic circuit diagram of a nonvolatile memory device according to an embodiment of the inventive concept.

FIG. 1 is a circuit diagram illustrating a nonvolatile memory device according to an embodiment of the inventive concept.

Referring FIG. 1, the nonvolatile memory device according to an embodiment of the inventive concept includes a cell array having a plurality of strings STRs. The cell array includes a plurality of bit lines BL1 to BL3, word lines WL1 to WL4, upper and lower selection lines USL1 to USL3 and LSL, and a common source line CSL. In addition, the cell array includes a plurality of strings STRs between the bit lines BL1 to BL3 and the common source line CSL.

Each of the strings STRs includes upper and lower selection transistors UST and LST and a plurality of memory cell transistors MC connected between the upper and lower selection transistors UST and LST in series. A drain of the upper selection transistor UST is connected to the bit lines BL1 and BL3, and a source of the lower selection transistor LST is connected to the common source line CSL. The common source line CSL is a line to which the sources of the lower selection transistors LSTs are connected in common.

Further, the upper selection transistors USTs are connected to the upper selection lines USL1 and USL3, and each of the lower selection transistors LSTs is connected to the lower selection line LSL. In addition, each of memory cells MCs is connected to word lines WL1 to WL4.

Because the above-described cell array is arranged in a three-dimensional structure, the strings STRs have a structure in which the memory cells MCs are connected to each other in series in a z-axis direction perpendicular to an x-y plane in parallel to the upper surface of a substrate. Accordingly, channels of the selection transistors UST and LST and channels of the memory cell transistors MCs may be formed perpendicular to x-y plane.

In the nonvolatile memory device with the three-dimensional structure, m memory cells may be formed in each x-y plane, and the x-y plane having the m memory cells may be stacked with n layers (where, m and n are natural numbers, respectively).

Figure 2:
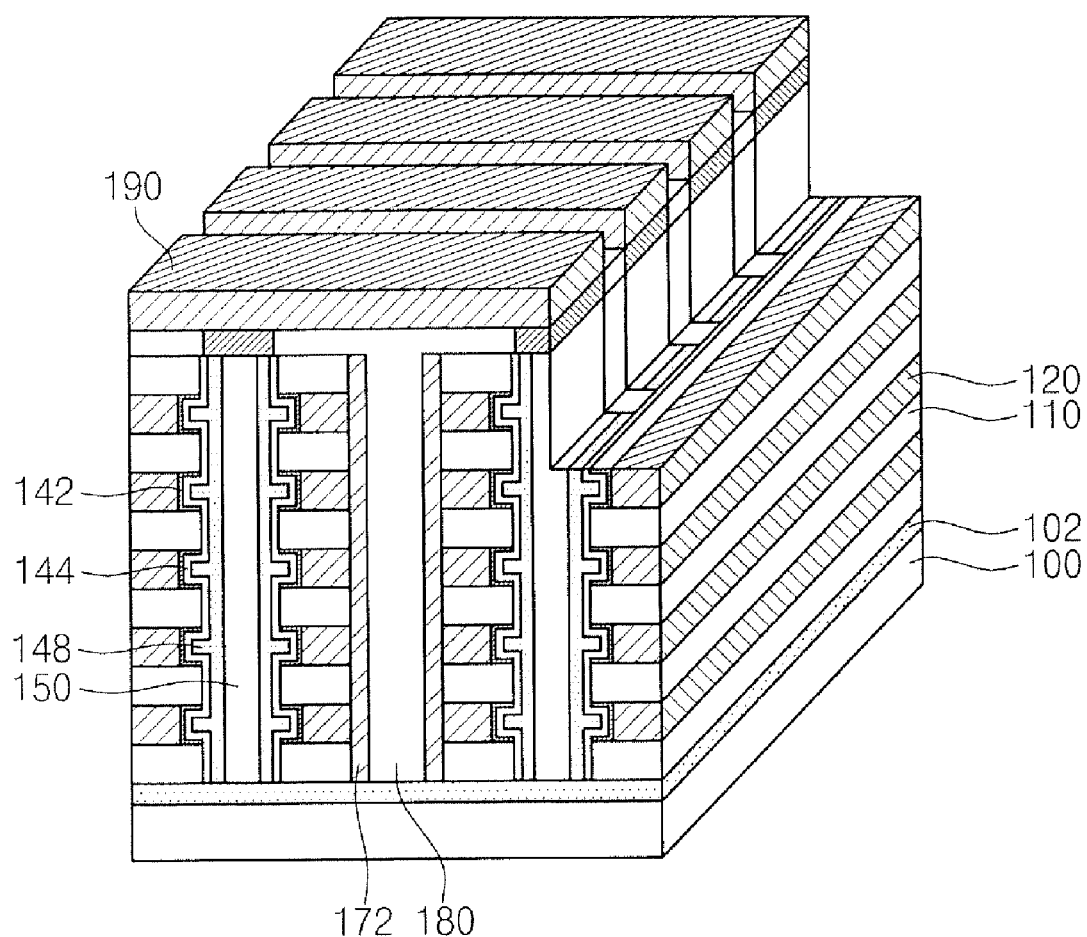
FIG. 2 is a diagram illustrating a nonvolatile memory device according to an embodiment of the inventive concept.

FIG. 2 is diagram illustrating the nonvolatile memory device according to an embodiment of the inventive concept.

Referring to FIG. 2, an impurity area (or well) 102 may be formed in the semiconductor substrate 100 to provide a common source line, and insulating layers and conductive layers may alternately be arranged on the impurity area 102.

More specifically, the insulating layer includes line-typed insulating layer patterns 110, and the conductive layer includes line-typed gate electrodes (i.e. word line) 170. The Insulating layer patterns 110 and the gate electrodes 170 are alternately stacked, thereby forming a stacked structure. The insulating layer patterns 110 or the gate electrodes 170 may be arranged so as to be spaced apart from each other. That is, the gate electrodes 170 may be three-dimensionally arranged on the semiconductor substrate 100. The gate electrodes 170 three-dimensionally arranged on the semiconductor substrate 100 may be a polycrystalline semiconductor layer formed by an epitaxial growth process. Further, the gate electrodes 170 may be a metal layer formed by a plating process.

Extended portions are formed between the insulating layer patterns 110 alternately stacked on the semiconductor substrate 100. The extended portions are formed by recessing first sidewalls of the gate electrodes 170. In the insulating layer pattern 110 and the gate electrodes 170 alternately stacked on the semiconductor substrate 100, the first sidewalls perpendicular to the semiconductor substrate 100 may be misaligned with each other. Specifically, the first sidewalls of the insulating layer patterns 110 and the first sidewalls of the gate electrodes 170 are arranged on different perpendicular lines in the stacked structure formed with the insulating layer pattern 100 and the gate electrodes 170. Furthermore, the stacked structures in which the first sidewalls are misaligned are spaced apart from each other at a predetermined distance, but may have a mirror-symmetry. That is, the stacked structures adjacent to each other may be arranged so that the misaligned first sidewalls face each other. For this reason, a distance between the gate electrodes 170 horizontally adjacent to each other may be greater than that between the insulating layer patterns 110 horizontally adjacent to each other.

Channel semiconductor patterns 148 are located on the first sidewalls of the stacked structure in which the insulating layer patterns 110 and gate electrodes 170 are alternately stacked. The channel semiconductor patterns 148 transverse the first sidewalls of the insulating layer patterns 110. The channel semiconductor patterns 148 may form a line perpendicular to the semiconductor substrate 100. Specifically, the channel semiconductor patterns 148 extend in the direction perpendicular to the semiconductor substrate 100, and the plurality of gate electrodes 170 is transversely formed on the sidewall of each channel semiconductor pattern 148. At this time, because the first sidewall of the stacked structure is misaligned, the channel semiconductor patterns 148 may be spaced apart from the first sidewalls of the gate electrodes 170. Further, because the first sidewalls of the stacked structures face each other, the channel semiconductor patterns 148 may be arranged so as to face each other. An insulating layer 150 may be formed between the channel semiconductor patterns 148 facing each other. In addition, the channel semiconductor patterns 148 extending in the direction perpendicular to the semiconductor substrate 100 are electrically connected to the bit lines 190 that transverse the gate electrodes 170. The bit lines 190 may come directly in contact with the upper surface of the channel semiconductor pattern 148 or may be electrically connected to the upper surface of the channel semiconductor pattern 148 through bit line contacts.

Furthermore, a charge storage layer 144 and a seed layer pattern 142 are provided between the first sidewall of the gate electrode 170 and the channel semiconductor pattern 148.

The seed layer pattern 142 may be locally formed between the insulating layer patterns 110 adjacent to each other. Specifically, the seed layer pattern 142 may be conformally formed along the first sidewall of the gate electrode 170 and the upper and lower surface of the insulating layer pattern 110. In addition, the seed layer patterns 142 are separated from any seed layer patterns 142 formed on the first sidewall of any gate electrodes 170. These seed layer patterns 142 may be a poly crystalline semiconductor layer. Moreover, the seed layer patterns 142 may be a metal layer such as Cu, Ru, Co, Pt, Pd, Au, and Ag. When the seed layer patterns 142 are the metal layer, metal barrier layers (not shown), such as Ti and TiN, may be formed between the seed layer patterns 142 and the gate electrodes 170.

Charge storage layers 144 may be formed between the seed layer patterns 142 and the channel semiconductor patterns 148. The charge storage layer 144 may be formed across the first sidewall of the stacked structure or be locally formed on the first sidewall of each of the gate electrodes 170 like the seed layer patterns 142. When the charge storage layer 144 is formed across the first sidewall of the stacked structure, it may be conformally formed along the first sidewall of the misaligned stacked structure. Because the charge storage layer conformally formed on the misaligned first sidewall is bent between the insulating layer patterns 110, it can reduce or prevent charges trapped in the charge storage layer 144 from being spread into the direction perpendicular to the semiconductor substrate 100. This charge storage layer 144 includes a charge tunneling layer, a charge trapping layer, and a charge blocking layer. The charge tunneling layer comes in contact with the channel semiconductor pattern, and the charge blocking layer is formed to come in contact with the seed layer pattern 142.

In the nonvolatile memory device according to an embodiment of the inventive concept, the first sidewalls of the gate electrode 170 and the insulating layer pattern 110 has a misaligned stacked structure. Therefore, this structure may increase a distance between the gate electrodes horizontally adjacent to each other. Further, because the charge storage layer 144 is formed along the misaligned first sidewalls of the gate electrode 170 and the insulating layer pattern 110, the charge storage layer 144 may be bent. Thus, it can reduce or prevent charges trapped in the charge storage layer 144 from being spread into the direction perpendicular to the semiconductor substrate 100.

Moreover, the second sidewalls of the insulating layer pattern 100 and the gate electrode 170 may be aligned with each other, and the second sidewalls of the insulating layer pattern 110 and the gate electrode 170, which are horizontally adjacent to each other, may also be arranged to face each other. An insulating layer 180 may be formed between the second sidewalls of the insulating layer pattern 110 and the gate electrode 170. Further, when the gate electrodes 170 are formed of the metal layer, a capping layer 172 may be formed on the surface of the second sidewalls of the insulating layer pattern 110 and the gate electrode 170 to prevent the metal material from being spread.

Next, a method of fabricating the nonvolatile memory device according to an embodiment of the inventive concept will be described in detail with reference to FIG. 3 to FIG. 10.

FIGS. 3 to 10 are diagrams sequentially illustrating methods of fabricating the nonvolatile memory device according to an embodiment of the inventive concept.

Figure 3:
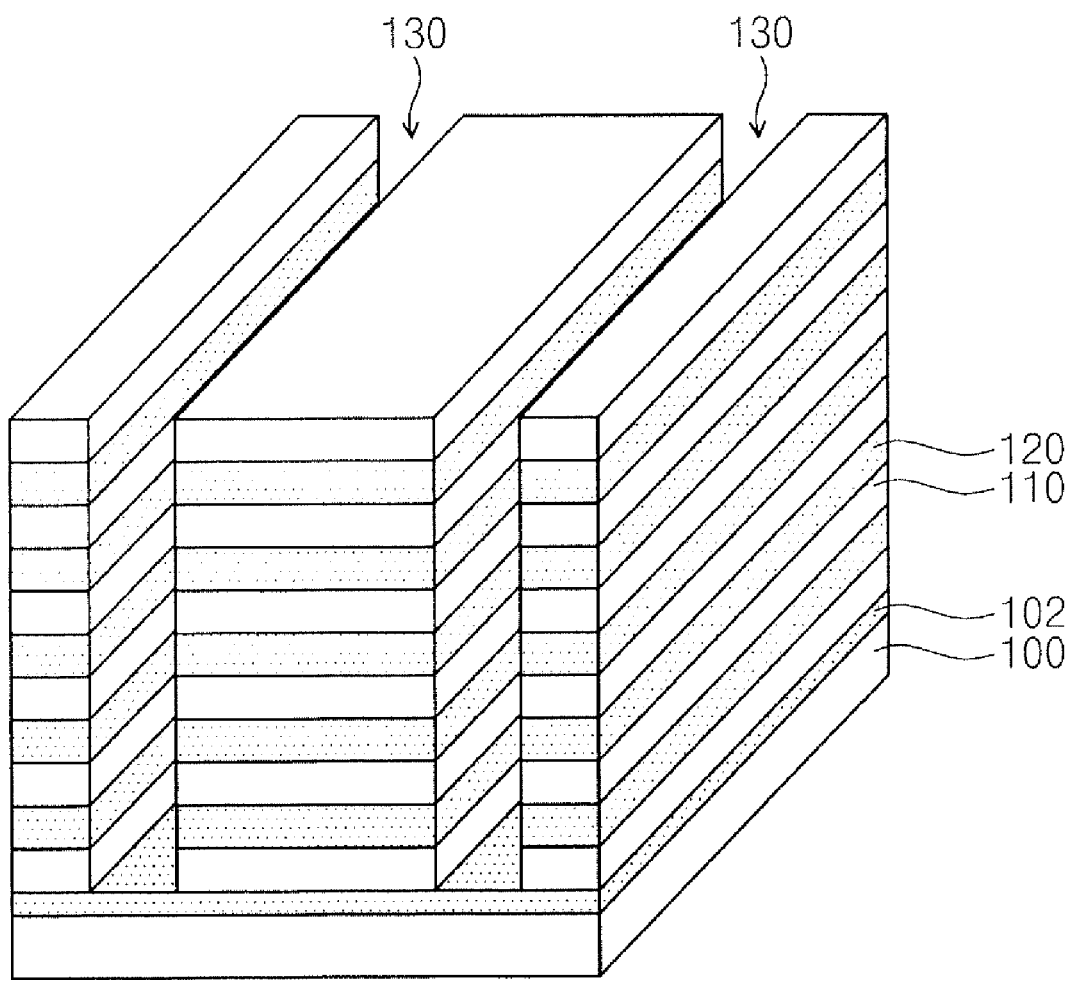
FIGS. 3 to 10 are diagrams illustrating a method for fabricating a nonvolatile memory device according to an embodiment of the inventive concept, in order of process.

Referring to FIG. 3, the first and second insulating layers 110 and 120 having a different wet etching rate are alternately stacked on the semiconductor substrate 100. The semiconductor substrate 100 may include an impurity area (or well) 102 and the first and second insulating layers 110 and 120 may be alternately stacked on the impurity area. At this time, the number of first and second insulating layers 110 and 120 to be stacked may be changed by the memory capacity, and the second insulating layer 120 may be formed of materials having a high wet etching rate as compared to the first insulating layer 110. For example, the first and second insulating layers 110 and 120 may be formed of a silicon oxide and a silicon nitride, respectively. Moreover, the first and second insulating layers 110 and 120 may be formed of silicon oxides that are different from each other in the wet etching rate.

Subsequently, first trenches 130 of a line shape are formed on the stacked first and second insulating layers 110 and 120. The first trenches 130 may be formed by a typical photolithography and etching process. The semiconductor substrate 100, i.e. the impurity area 102, may be exposed through the first trenches 130. The first trenches 130 are formed of a line and may be formed in parallel with each other so as to be spaced apart from each other at a predetermined distance. Therefore, as the first trenches 130 are formed, the first sidewalls of the stacked first and second insulating layers 110 and 120 may be exposed by the first trenches 130.

Figure 4:
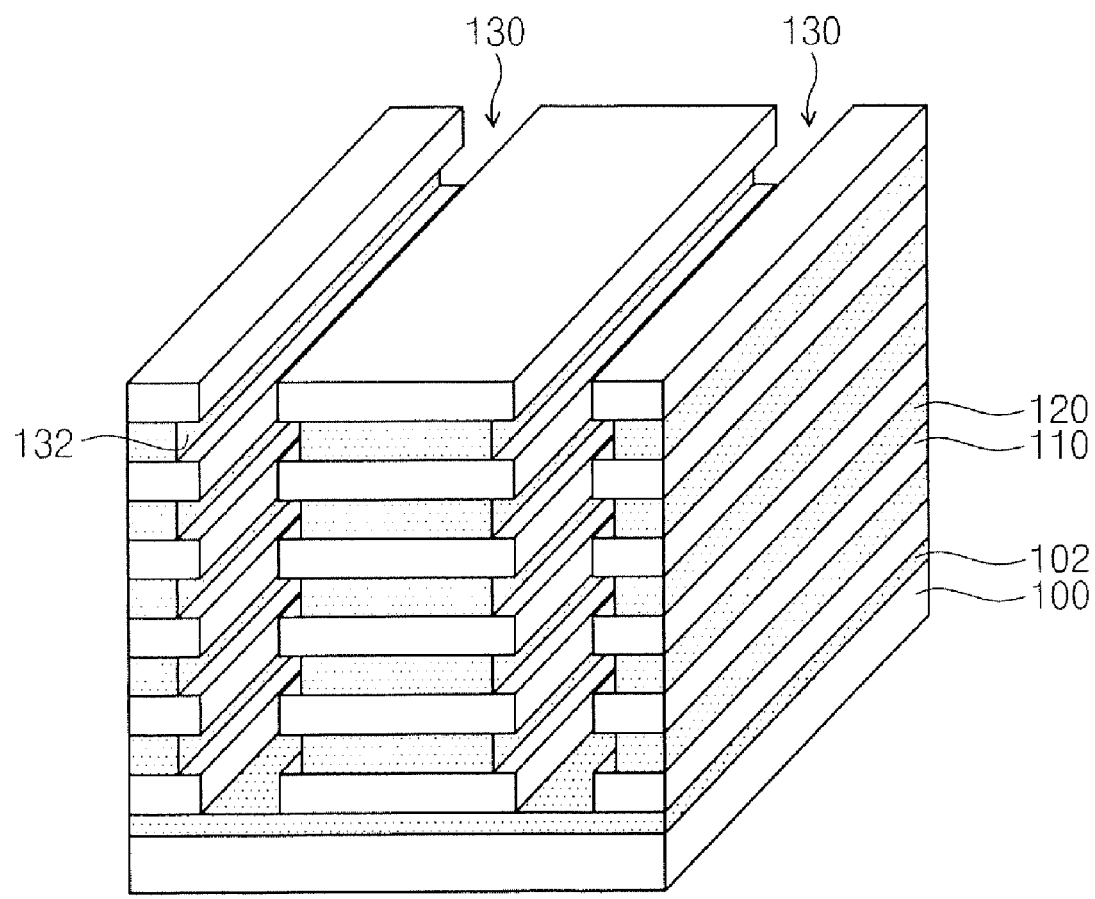

Referring to FIG. 4, extended portions 132 may be formed between the first insulating layers 110 by removing a portion of the second insulating layers 120 exposed by the first trench 130. The extended portions 132 extend in the direction in parallel with the semiconductor substrate 100 from the first trench 130.

More specifically, a portion of the second insulating layers 120 may be etched by supplying a wet etchant into the first trench 130 exposing the first sidewalls of the first and second insulating layers 110 and 120. At this time, because the second insulating layers 120 are higher in wet etching rate than the first insulating layers 110, when the wet etchant is supplied through the first trench 130, the extended portions 132 may be formed between the first insulating layers 110. For this reason, the first trench 130 may be formed that vertically penetrates the first and second insulating layers 110 and 120 and includes the extended portions 132 between the first insulating layers 110. In other words, the first sidewalls of the first insulating layer 110 and the second insulating layer 120, which are exposed by the first trench 130, may be misaligned. Therefore, the width of the first trench 130 in the first insulating layers 110 is smaller than that of the first trench 130 in the second insulating layers 120. As a result, the inner wall of the first trench 130 may be bent.

Figure 5:
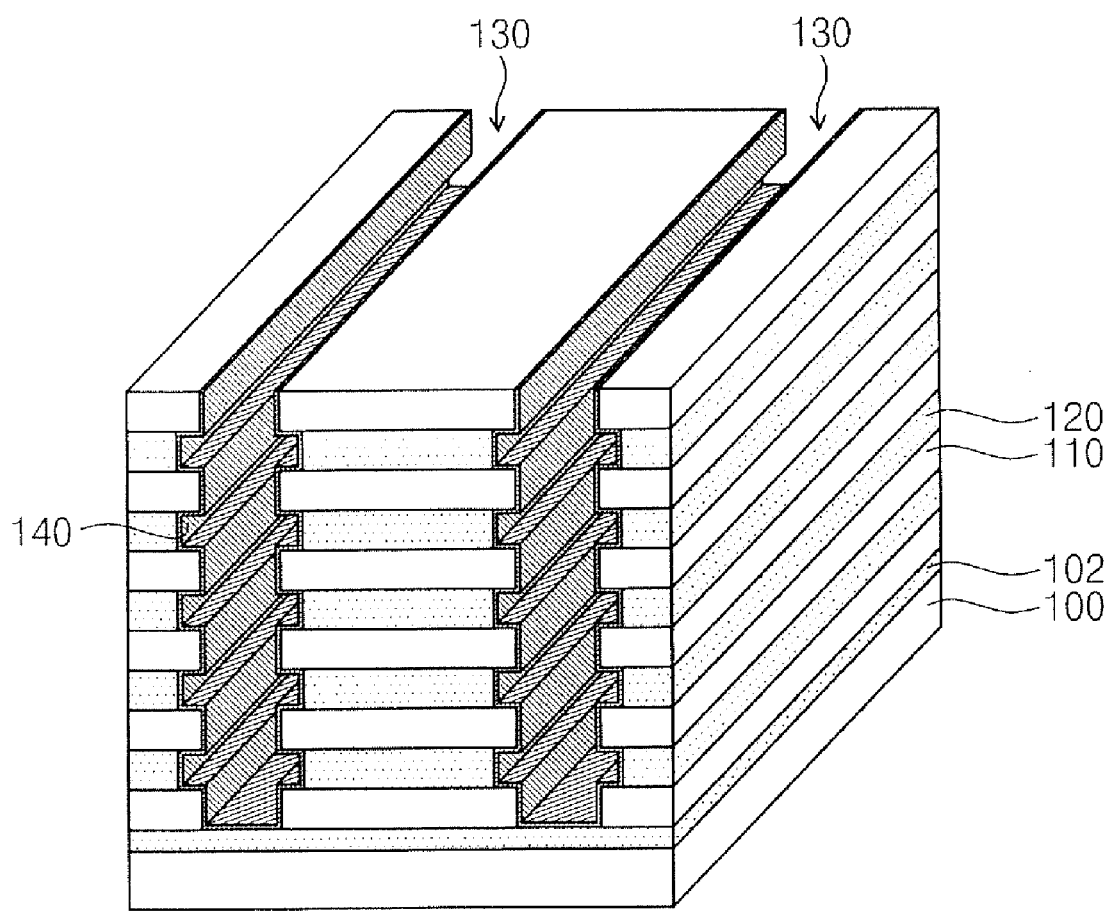

Referring to FIG. 5, a seed layer 140 is conformally formed along an inner wall of the first trench 130 in which the extended portions 132 are formed. Specifically, the seed layer 140 may be deposited on a first sidewall, an upper surface, and a lower surface of the first insulating layer 110 exposed by the first trench 130 and on a first sidewall of the second insulating layer 120 exposed by the first trench 130. The seed layer deposition process may proceed to cover the first sidewall of the second insulating layer 120 in the extended portion. For example, the seed layer 140 may be a semiconductor layer, and this seed layer 140 may be a thin layer including Si, Ge, or a mixture of these materials. A polysilicon layer may typically be used. Furthermore, the seed layer 140 may be formed of metal materials, such as Cu, Ru, Co, Pt, Pd, Au, or Ag. Moreover, the seed layer 140 may be a metal nitride layer such as TiN, TaN, or WN. The seed layer 140 may be formed to have a thickness about 2 to 20 nm by using Chemical Vapor Deposition (CVD) or an Atomic Layer Deposition (ALD).

Figure 6:
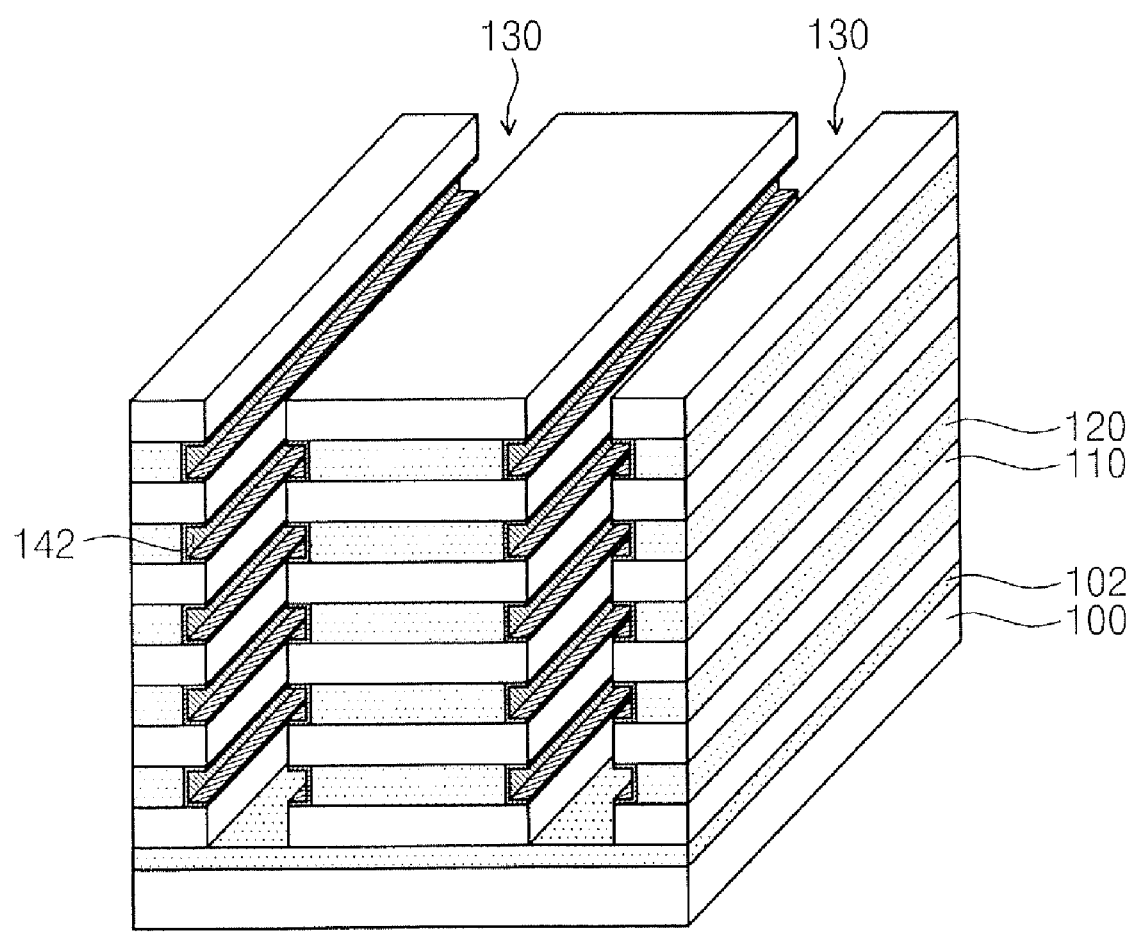

Referring to FIG. 6, seed layer patterns 142 may be locally formed in the extended portion 132 by removing the seed layer formed on the first sidewalls of the first insulation layer 110. The seed layer formed on the first sidewalls of the first insulation layer 110 may be etched by an anisotropic etching, such as an etch-back process. At this time, the seed layer 140 formed in the extended portion 132, that is, the seed layer 140 formed on the first sidewall of the second insulating layer 120 may remain due to the characteristics of the anisotropic etching process. Alternatively, after forming the seed layer 140, the seed layer 140 formed on the first sidewall of the first insulating layer 110 may be removed by embedding sacrificial layers (not shown) in the first trenches 130 and carrying out a photolithography and etching process.

As the seed layer 140 is removed by the anisotropic etching, seed layer patterns 142 may be formed. The seed layer patterns 142 come in contact with the first sidewall of the second insulating layer 120 in the extended portion 132 and extend to the upper and lower surface of the first insulating layer 110. The seed layer patterns 142, which are vertically adjacent to each other, may be electrically isolated from each other.

Figure 7:
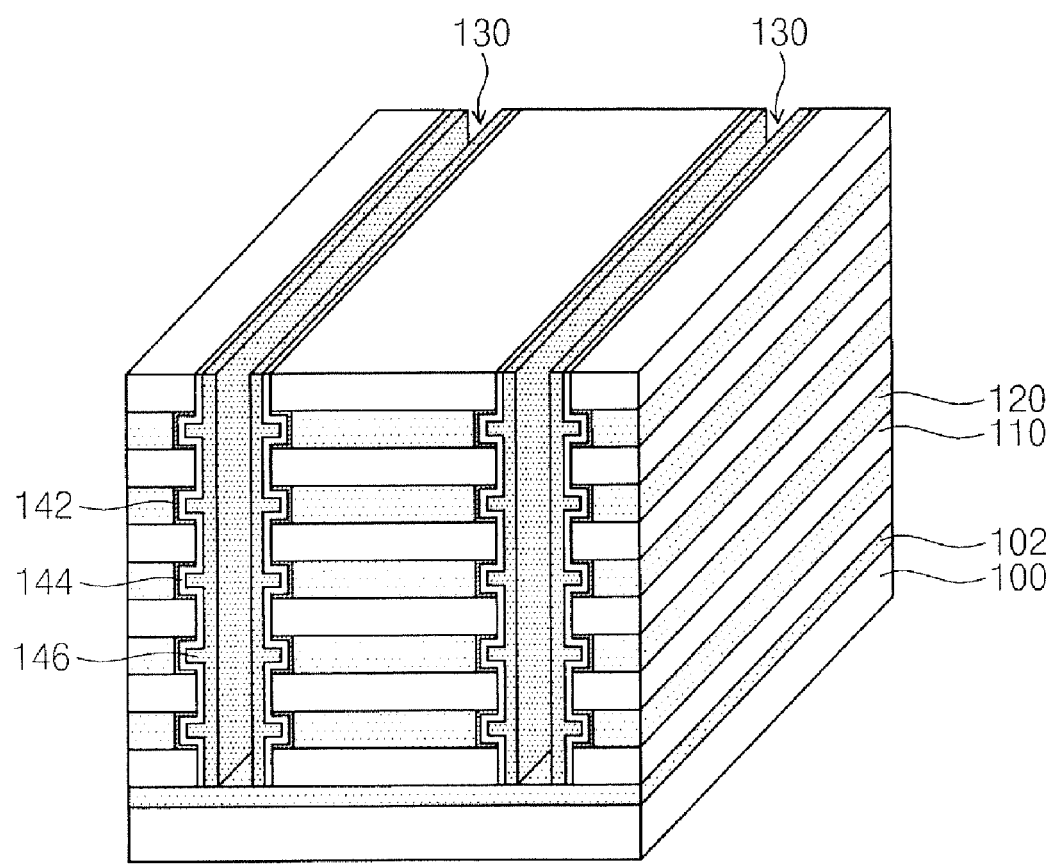

Referring to FIG. 7, a charge storage layer 144 and a semiconductor layer 146 are sequentially formed along the surface of the first trench 130 including the extended portions in which the seed layer patterns 142 are formed.

The charge storage layer 144 may conformally be formed along the first sidewall of the first insulating layer 110 and the surface of the seed layer pattern 142. That is, the charge storage layer 144 may cover the surface of the extended portions in which the seed layer patterns 142 are formed and the first sidewall of the first insulating layer 110. Because the first trench 130 includes the extended portions 132, the charge storage layer 144 may be bent. This charge storage layer 144 may be formed by sequentially depositing a charge blocking layer, a charge trapping layer, and a charge tunneling layer. That is, an oxide layer, a nitride layer, and an oxide layer may be sequentially formed on the surface of the first trench 130.

Moreover, the charge storage layer 144 may be locally formed in the extended portion 132 together with the seed layer pattern 142. That is, after sequentially forming the seed layer and the charge storage layer on the inner wall of the first trench 130 provided with the extended portion 132, the seed layer pattern and the charge storage layer pattern may be locally formed in the extended portion 132 by removing the seed layer and the charge storage layer formed on the first sidewall of the first insulating layer 110. Ultimately, the seed layer pattern and the charge storage layer pattern, which are formed on the first sidewall of the second insulating layer 120 and extend to the upper and lower surface of the first insulating layer 110, may be formed in the extended portion 132.

After forming the charge storage layer 146 on the inner wall of the first trench 130, a channel semiconductor layer 146 is formed on the charge storage layer 144. More specifically, the channel semiconductor layer 146 is conformally deposited along the inner wall of the first trench 130 in which the charge storage layer 144 is formed. At this time, the channel semiconductor layer 146 may be deposited by the thickness that can embed the extended portion 132 formed between the first insulating layers 110. Then, the channel semiconductor layer 146, which is formed at the impurity region 102 and the upper surface of the uppermost first insulating layer 110, may be removed by anisotropic etching.

Accordingly, the channel semiconductor layers 146 facing each other may be formed in the first trench 130.

These channel semiconductor layers 146 may be made of a polycrystalline semiconductor and may be formed by using a chemical vapor deposition process. Furthermore, the channel semiconductor layer 146 made of a single crystalline semiconductor may be formed in the first trenches 130 by carrying out an epitaxial growth process that uses the semiconductor substrate 100 exposed by the first trenches 130 as a seed layer.

After forming the channel semiconductor layers 146, an insulating layer 150 may be formed between the channel semiconductor layers 146 facing each other by embedding insulation materials in the first trench 130 and planarizing it.

Figure 8:
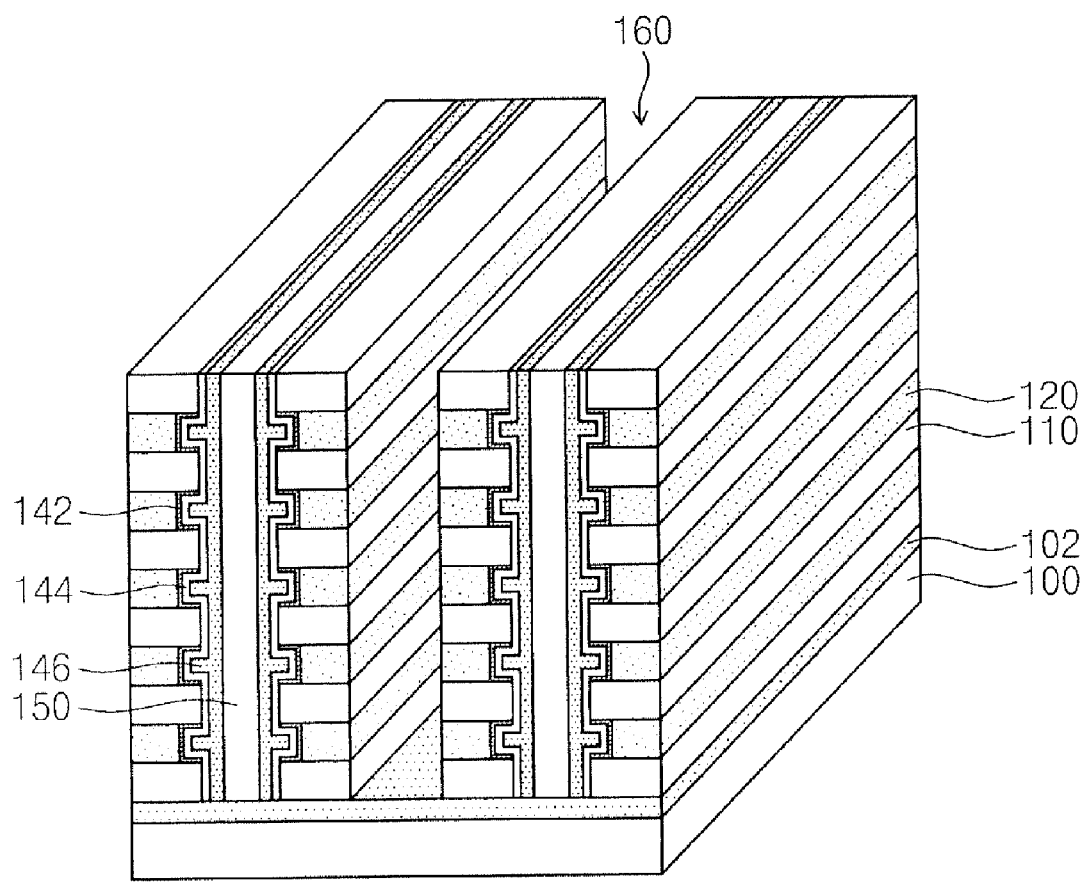

Referring to FIG. 8, second trenches 160 are formed between the first trenches 130 provided with the channel semiconductor layers 146, thereby exposing second sidewalls of the first and second insulating layers 110 and 120. The second trenches 160 may be formed by carrying out photolithography and dry etching processes with respect to the stacked first and second insulating layers 110 and 120. At this time, the second sidewalls of the first and second insulating layers 110 and 120 exposed by the second trenches 160 may be aligned by the anisotropic etching process. As the first and second trenches 130 and 160 are formed, the first and second insulating layers 110 and 120 on the semiconductor substrate 100 may form a line.

Figure 9:
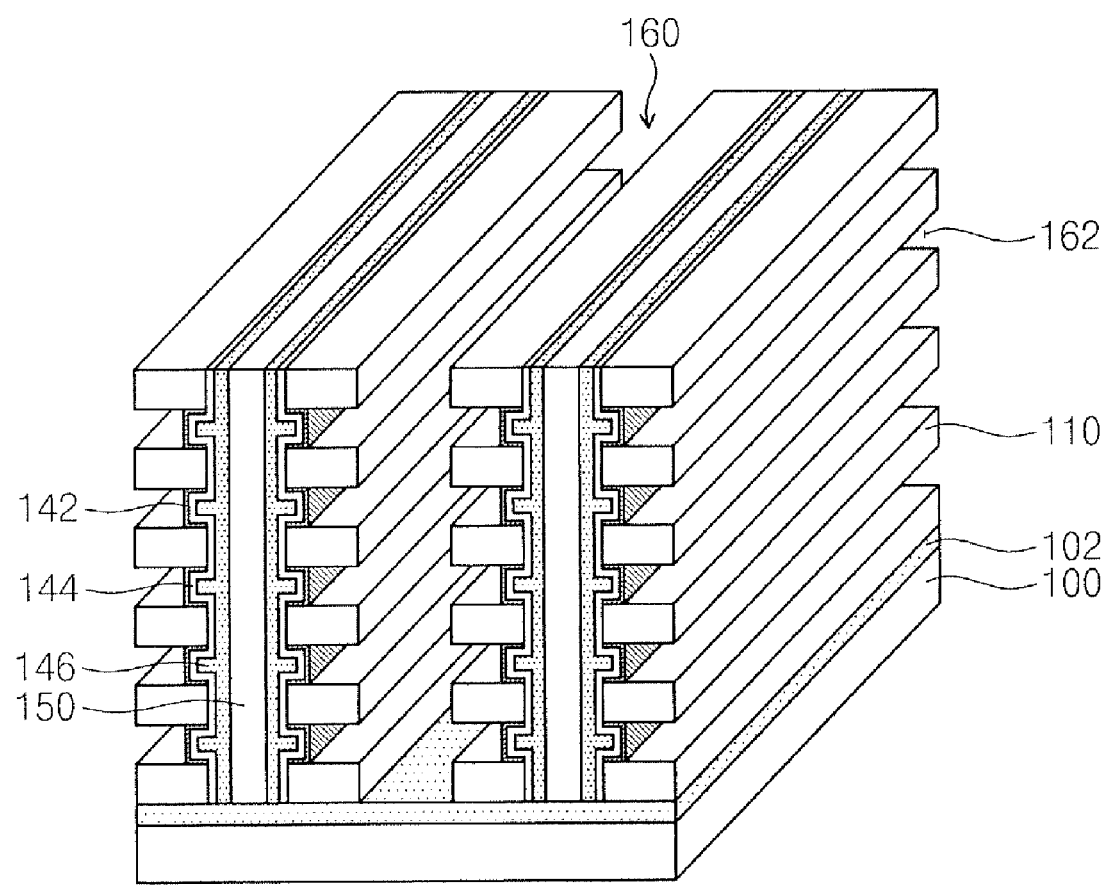

Referring to FIG. 9, the seed layer pattern 142 is exposed in the second trench 160 by removing the second insulating layers 120 formed between the first insulating layers 110.

More specifically, a wet etchant is supplied into the second trench 160 exposing the second sidewalls of the first and second insulating layers 110 and 120. At this time, because the first insulating layer 110 and the second insulating layer 120 are formed of materials having relatively large differences in wet-etching-rate, the second insulating layers 120 may selectively removed. Accordingly, an opening 162 may be formed between the stacked first insulating layers 110 to expose the seed layer pattern 142. Further, because the channel semiconductor layer 146 and the charge storage layer 144 are not exposed in the second trench 160 during removal of the second insulating layers 120 in their entireties through the wet etching process, it can reduce or prevent the channel semiconductor layer 146 and the charge storage layer 144 from being damaged by the wet etching.

Figure 10:
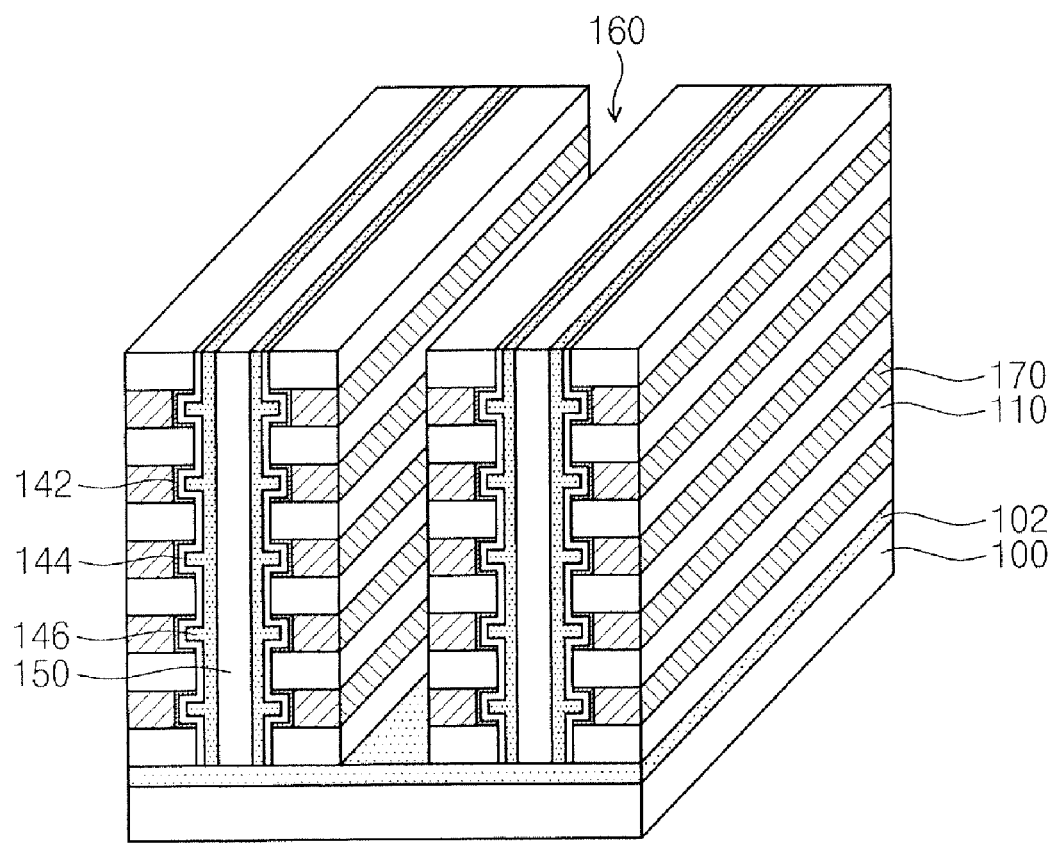

Referring to FIG. 10, gate electrodes 170 are formed on the seed layer pattern 142 by filling conductive materials in the opening 162. The gate electrodes 170 are locally formed between the first insulating layers 110 and electrically isolated from other gate electrodes 170. Therefore, the gate electrodes 170 may be three-dimensionally disposed on the semiconductor substrate 100.

More specifically, when the seed layer pattern 142 exposed in the second trench 160 is a polycrystalline semiconductor layer, the gate electrodes 170 may be formed between the first insulating layers 110 by carrying out the epitaxial growth process using the seed layer pattern 142. The epitaxial growth process may be controlled so that the second sidewalls of the first insulating layer 110 may be filled with the conductive materials.

In addition, when the seed layer pattern 142 is formed of metal materials, such as a copper, the gate electrodes 170 may be formed by using electro plating or electroless plating. In forming the gate electrodes 170 by the plating process, the seed layer pattern 142 may increase the uniformity of plating layers and may serve as an initial nucleation site.

In forming the gate electrodes 170 by using the epitaxial growth process and the plating process, the gate electrodes 170 may be locally formed between the first insulating layers 110 without a patterning process for forming the gate electrodes 170. That is, the gate electrodes 170 may be formed between the first insulating layers 110 without etching a conductive layer as high as the first insulating layers 110 stacked on the semiconductor substrate 100.

Referring again to FIG. 2, after forming the gate electrodes 170 made of the metal materials, the capping layer 172 may be formed on the inner wall of the second trench 160. The capping layer 172 may be formed of any material selected from, for example, SiN, Ta, TaN, TaSiN, Ti, TiN, TiSiN, W, and WN or combinations thereof.

The insulating layer 180 is embedded in the second trench 160 to cover the second sidewalls of the first insulating layer 110 and the surface of the gate electrodes 170.

Then, the channel semiconductor patterns 148 may be formed by patterning the channel semiconductor layer 146 in the form of line, which is formed on the first sidewall. Accordingly, it may form the line-shaped channel semiconductor patterns 148 that intersect one-side wall of the stacked gate electrodes 170 and are spaced apart from each other. The channel semiconductor layer 146 may be patterned in the form of a line before the second trenches 160 are formed. Subsequently, the bit lines 190 may be formed on the upper part of the gate electrodes 170 that are three-dimensionally disposed. The bit lines 190 intersect the gate electrodes 170 and are electrically connected to the channel semiconductor patterns 148.

Figure 11:
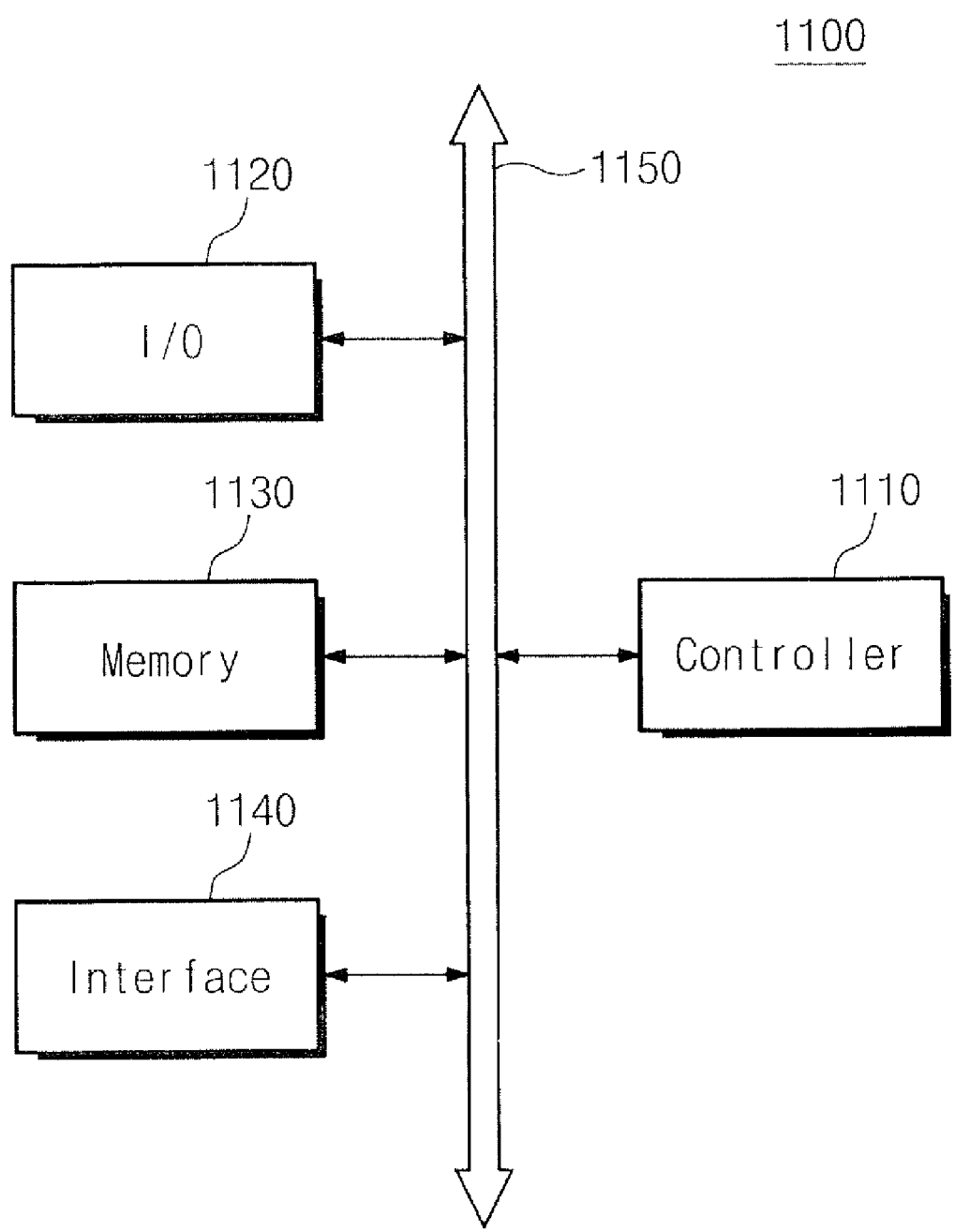
FIG. 11 is a schematic block diagram illustrating an example of a memory system including a nonvolatile memory device according to an embodiment of the inventive concept.

FIG. 11 is a schematic block diagram illustrating an example of a memory system including a nonvolatile memory device according to embodiments of the inventive concept.

Referring to FIG. 11, a memory system 1100 may be applicable to a PDA, portable computer, web tablet, wireless phone, mobile phone, digital music player, memory card, and/or all of devices capable of transmitting and/or receiving information in wireless environment.

The memory system 1100 includes a controller 1110, an input/output (I/O) device 1120, such as a keypad, keyboard, and display, a memory 1130, an interface 1140, and a bus 1150. The memory 1130 and the interface 1140 communicate with each other through the bus 1150.

The controller 1110 includes at least one microprocessor, digital signal processer, microcontroller, or other processor devices similar to these. The memory 1130 may be used for storing instructions executed by the controller. The I/O device 1120 may receive data or signals from the exterior of the system 1100 or may output data or signals to the exterior of the system 1100. For example, the I/O device 1120 may include a keypad, a keyboard, and a display device.

The memory 1130 includes a nonvolatile memory device according to embodiments of the inventive concept. The memory 1130 may further include other type of memory, such as volatile memory capable of arbitrarily accessible whenever necessary, and various types of memories.

The interface 1140 transmits data to a communication network or receives data from a communication network.

Figure 12:
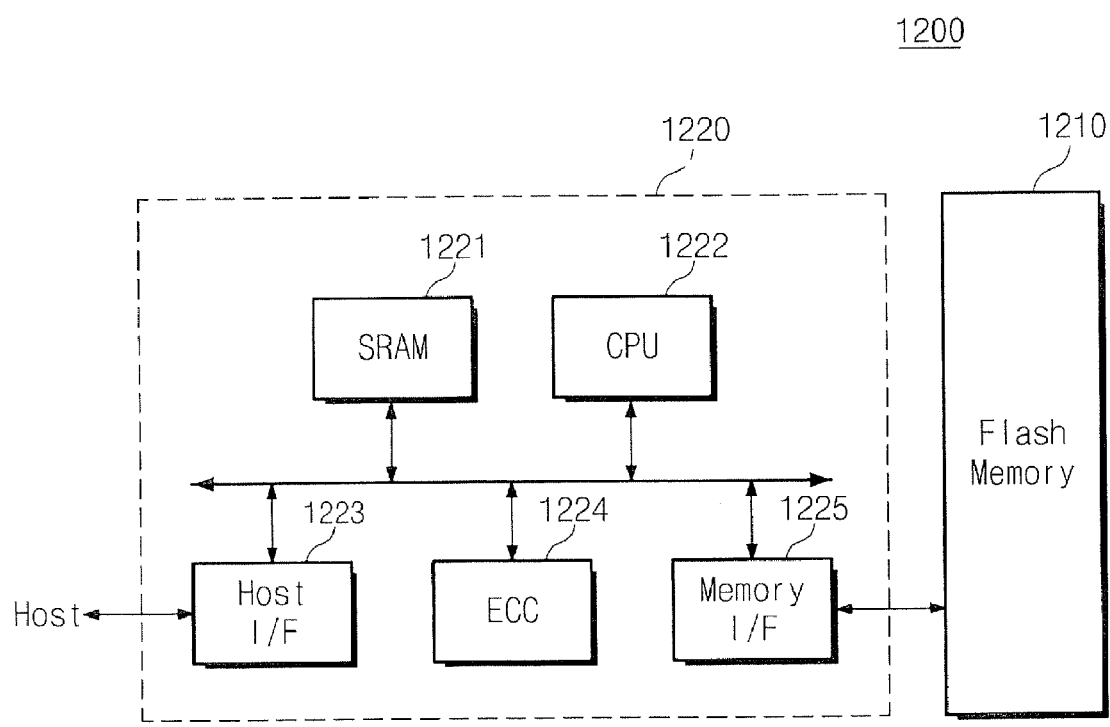
FIG. 12 is a schematic block diagram illustrating an example of a memory card including a nonvolatile memory device according to an embodiment of the inventive concept.

FIG. 12 is a schematic block diagram illustrating an example of memory card including a nonvolatile memory device according to embodiments of the inventive concept.

Referring to FIG. 12, a memory card 1200 is provided with a flash memory device according to embodiments of the inventive concept to support a mass data storing capability. The memory card 1200 may include a memory controller 1220 for controlling all the data exchanges between a host and the flash memory device 1210.

An SRAM 1221 is used as an operational memory of a CPU (Central Processing Unit) 1222. A host interface 1223 may be provided with a data exchange protocol between the memory card 1200 and the host. An ECC (Error Correction Code) 1224 may detect and correct errors of data read from the flash memory device 1210. A memory interface 1225 interfaces with the flash memory device 1210. The CPU 1222 controls overall operations for the data exchange of the memory controller 1220. Even though not illustrated in FIG. 11, it will be apparent to those skilled in the art that the memory card 1200 may further include a ROM (not shown) that stores code data for interfacing with the host.

According to embodiments of the inventive concept, the flash memory device and the memory card or the memory system may provide a memory system having a high reliability through the flash memory device 1210 in which an erasing characteristic of dummy cells is improved. In particular, the flash memory device according to the embodiments of the inventive concept may be provided in the memory system, such as a semiconductor disk device (SSD: Solid State Disk). In this case, it can provide a memory system having a high reliability by preventing a reading error caused by the dummy cells.

Figure 13:
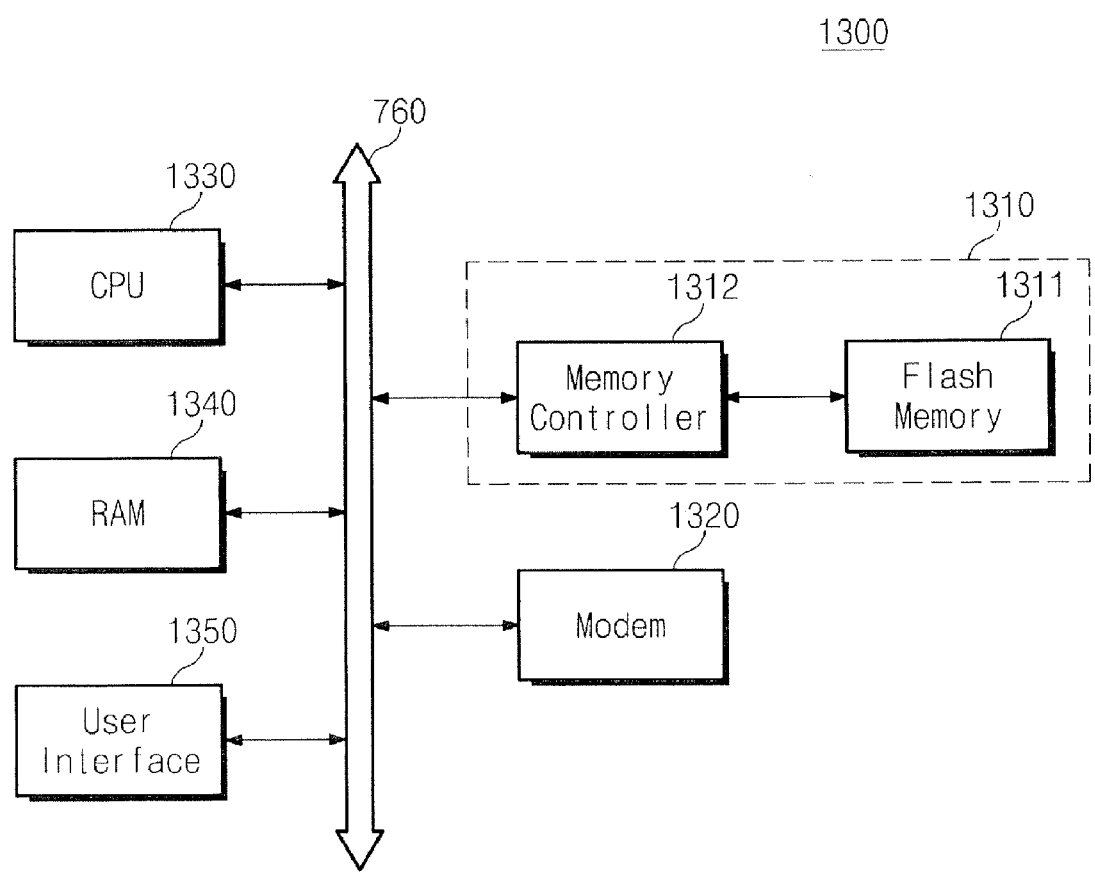
FIG. 13 is a schematic block diagram illustrating an example of an information process system including a nonvolatile memory device according to an embodiment of the inventive concept.

FIG. 13 is a schematic block diagram illustrating an example of an information processing system including a nonvolatile memory device according to embodiments of the inventive concept.

Referring to FIG. 13, a flash memory system 1310 is mounted into an information processing system, such as a mobile products or a desk top computer. An information processing system 1300 includes a flash memory system 1310, a modem 1320, a central processing unit 1330, a RAM 1340, and a user interface 1350, which are electrically connected to a system bus 1360, respectively. The flash memory system 1310 may have substantially the same configuration as the above-described memory system or flash memory system. Data, which are processed by the CPU 1330 or input from the exterior, are stored in the flash memory system 1310. Here, the flash memory system may be configured by the semiconductor disk device (SSD). In this case, the information processing system 1300 can stably store the mass data in the flash memory system 1310. Moreover, as the reliability increases, the flash memory system 1310 may reduce resources required for error correction, thereby providing a high-speed data exchange function to the information processing system 1300. Although not illustrated in FIG. 13, it will be apparent to those skilled in the art that an application chipset, a Camera Image Processor (CIS), an input/output device and other functionality may be further provided to the information process system 1300 according to the embodiments of the inventive concept.

The flash memory system or the memory system according to the embodiments of the inventive concept may be mounted by various types of packages. For example, the flash memory system or the memory system may be packaged and mounted in such manners as Package on Package (PoP), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

In the nonvolatile memory device and the method of fabricating the nonvolatile memory device according to the inventive concept, because one-side walls of the gate electrode and insulating layer pattern are misaligned with each other, the distance between the gate electrodes horizontally adjacent to each other, that is, the distance between the charge trapping layers may increase.

In addition, because the charge storage layer is formed along sidewalls of the gate electrode and insulating layer pattern that are misaligned with each other, the charge storage layer may be bent. Therefore, it can suppress a spreading phenomenon in which the charges trapped in the charge storage layer spreads out in a direction perpendicular to the semiconductor substrate.

Furthermore, because the gate electrodes disposed three-dimensionally on the semiconductor substrate are formed by the epitaxial growth or electro-plating using the seed layer patterns, the patterning process is not required with respect to the gate electrodes, thereby improving process efficiency and reliability of the nonvolatile memory device.

Although the inventive concept has been described in connection with embodiments of the inventive concept illustrated in the accompanying drawings, it is not limited thereto. It will be apparent to those skilled in the art that various substitution, modifications and changes may be thereto without departing from the scope and spirit of the inventive concept.

That which is claimed is:

1. A nonvolatile memory device, comprising:
    conductive patterns three-dimensionally arranged on a semiconductor substrate;
    semiconductor patterns extending from the semiconductor substrate and intersecting one-side walls of the conductive patterns;
    charge storage layers interposed between the semiconductor patterns and one-side walls of the conductive patterns; and
    seed layer patterns interposed between the charge storage layers and one-side walls of the conductive patterns.

2. The nonvolatile memory device as set forth in claim 1, further comprising:
    insulating interlayer patterns interposed with the conductive patterns; and
    wherein the one-side walls of the conductive patterns and one-side walls of the insulating layer patterns adjacent thereto are disposed on different perpendicular lines.

3. The nonvolatile memory device as set forth in claim 2, further comprising:
    extended portions corresponding to recessed portions of the one-side walls of the conductive patterns disposed between the insulating layer patterns vertically adjacent to each other;
    wherein the seed layer patterns are disposed in the extended portions.

4. The nonvolatile memory device as set forth in claim 2, wherein a distance between the conductive patterns horizontally adjacent to each other is larger than a distance between the insulating layer patterns horizontally adjacent to each other.

5. The nonvolatile memory device as set forth in claim 1, wherein respective ones of the seed layer patterns adjacent to respective ones of the conductive patterns are isolated from respective ones of the seed layer patterns adjacent to respective other ones of the conductive patterns.

\* \* \* \* \*